(12) United States Patent
Jaffrey et al.

(10) Patent No.: US 10,175,287 B2
(45) Date of Patent: Jan. 8, 2019

(54) CABLE MONITORING SYSTEM AND METHOD USING NOISE-DOMAIN REFLECTOMETRY

(71) Applicant: Cameron International Corporation, Houston, TX (US)

(72) Inventors: Andrew Jaffrey, Oldmeldrum (GB); Hyrum Salvador Hilario, Houston, TX (US); Kartik Subramanian, Mountain View, CA (US); Michael H. Lampe, Austin, TX (US); Claire Hammett, Somerville, MA (US); Edward Cates, Austin, TX (US)

(73) Assignee: Cameron International Corporation, Houston, TX (US)

(*) Notice: Subject to any disclaimer, the term of this patent is extended or adjusted under 35 U.S.C. 154(b) by 0 days.

(21) Appl. No.: 15/224,353

(22) Filed: Jul. 29, 2016

(65) Prior Publication Data
US 2018/0034543 A1 Feb. 1, 2018

(51) Int. Cl.
*H04B 10/079* (2013.01)
*H04B 10/071* (2013.01)
*G01R 31/11* (2006.01)

(52) U.S. Cl.
CPC ............ *G01R 31/11* (2013.01); *H04B 10/071* (2013.01); *H04B 10/0791* (2013.01)

(58) Field of Classification Search
None
See application file for complete search history.

(56) References Cited

U.S. PATENT DOCUMENTS

| 4,687,377 A * | 8/1987 | Langner .............. E21B 43/0135 166/338 |
| 2010/0141264 A1 * | 6/2010 | Ravot .................... G01R 31/11 324/533 |
| 2014/0266238 A1 * | 9/2014 | Furse ................. G01R 31/2841 324/533 |
| 2016/0131692 A1 | 5/2016 | Jaffrey |

OTHER PUBLICATIONS

Campbell et al., "Induced Electric Currents in the Alaska Oil Pipeline Measured by Gradient Fluxgate and SQUID Magnetometers," IEEE Transactions on Geoscience and Remote Sensing, Jul. 1980, vol. GE-18(3): pp. 244-250.
Lo et al., "Noise-Domain Reflectometry for Locating Wiring Faults," IEEE Transactions on Electromagnetic Compatibility, Feb. 2005, vol. 47(1): pp. 97-104.
Takagi et al., "DC Cable Sensors for Locating Underwater Telecommunication Cables," Oceans '96. MTS/IEEE, Prospects for the 21st Century Conference Proceeding, Sep. 1996, vol. 1: pp. 339-344.

* cited by examiner

*Primary Examiner* — Darren E Wolf
(74) *Attorney, Agent, or Firm* — Helene Raybaud

(57) ABSTRACT

A system and method to monitor a cable using noise-domain reflectometry. A receiver is configured to receive a signal and a reflection of the signal transmitted through the cable. The reflection of the signal can be indicative of a fault condition relating to the integrity of the cable. A processor is in communication with the receiver and configured to analyze the signal and the reflection using noise-domain reflectometry and determine the fault condition of the cable.

20 Claims, 4 Drawing Sheets

CABLE MONITORING SYSTEM AND METHOD USING NOISE-DOMAIN REFLECTOMETRY

CONTEXT

This section is intended to provide relevant contextual information to facilitate a better understanding of the various aspects of the described embodiments. Accordingly, it should be understood that these statements are to be read in this light and not as admissions of prior art.

In some offshore drilling operations, a high pressure wellhead housing at the sea floor is positioned at the upper end of a subterranean wellbore lined with casing; a blowout preventer (BOP) stack is mounted to the high pressure wellhead housing; and a lower marine riser package (LMRP) is mounted to the BOP stack. The upper end of the LMRP may include a flex joint coupled to the lower end of a drilling riser that extends upward to an offshore vessel at the sea surface. A drill string is hung from the drilling vessel through the drilling riser, the LMRP, the BOP stack, and the high pressure wellhead housing into the wellbore.

During drilling operations, drilling fluid, or mud, is pumped from the sea surface down the drill string, and returns up the annulus around the drill string. In the event of a rapid invasion of formation fluid into the annulus, commonly known as a "kick," the BOP stack and/or LMRP may actuate to help seal the annulus and control the fluid pressure in the wellbore. In particular, the BOP stack and LMRP include closure members, or cavities, designed to help seal the wellbore and prevent the release of high-pressure formation fluids from the wellbore. Thus, the BOP stack and LMRP function as pressure control devices.

Pressure balanced oil-filled (PBOF) cables are used to transmit electrical signals, such as data and power, to subsea equipment (such as control pods). The PBOF cables can deteriorate over time allowing sea water to enter the housing of the cable, which can interrupt or reduce the electrical performance of the cable. Further, the PBOF cables can become damaged from impacts produced by currents, resulting in faults (such as breaks) in the fiber optic or electrical lines. To circumvent these faults, the PBOF cables can be replaced on a schedule, such as every 18 months, regardless of the actual integrity of the cables. This method of replacing the cables on a schedule is inefficient as some cables can be discarded while they are still functional or others can be used while they are faulty. There is a need to monitor the integrity of the PBOF cables deployed sub sea.

DESCRIPTION OF THE DRAWINGS

For a detailed description of the embodiments of the disclosure, reference will now be made to the accompanying drawings in which.

DETAILED DESCRIPTION

This disclosure is generally related to cables used to transmit electrical signals, such as data and power, between subsea equipment. Specifically, the disclosure provides a non-intrusive method and system for monitoring the integrity of the subsea cables using noise-domain reflectometry.

Figure 1:
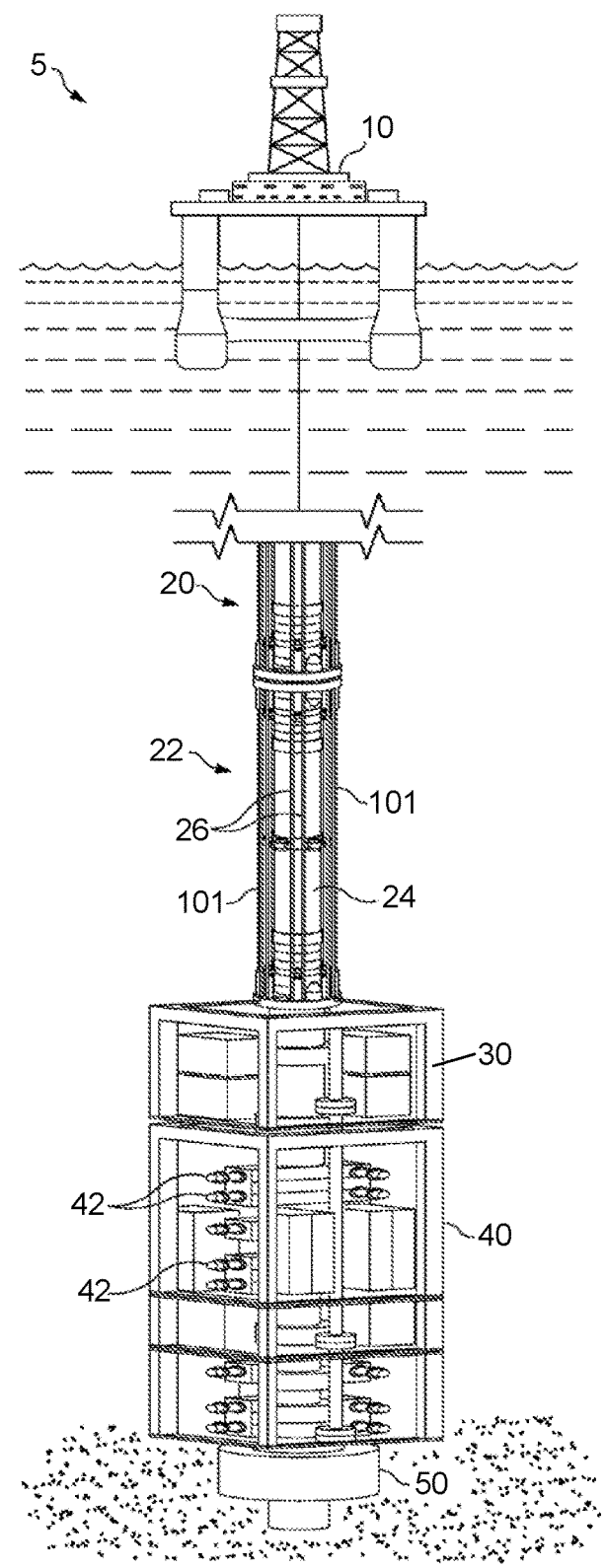
FIG. 1 shows a schematic view of a well system in accordance with one or more embodiments of the present disclosure.

FIG. 1 shows a schematic view of a well system 5 in accordance with one or more embodiments. The well system 5 includes an offshore vessel 10, for example a drilling rig, floating production storage and offloading (FPSO) unit, platform, floating platform, or the like. The well system 5 also includes a riser string 20, an LMRP 30, a blowout preventer (BOP) stack 40, and a wellhead 50. The blowout preventer stack 40 is connected to the wellhead 40 located on the seabed. The blowout preventer stack 40 includes multiple blowout preventers 42 in a vertical arrangement to control well bore pressure. The riser string 20 is coupled to the upper end of the LMRP 30. The riser string 20 includes multiple riser sections or riser joints 22 connected end to end and extending upward to the offshore vessel 10.

Each riser joint 22 includes a main tube 24 and one or more secondary tubes 26 disposed along the main tube 24. The riser joints 22 also includes one or more cables 101, such as a multi-core umbilical, that run along-side the riser string 20 to provide a communication path and/or power line to the BOP stack 30 or any other suitable subsea tool and/or equipment deployed in a subsea environment. The secondary tubes 26 share the loads applied to the riser joint 22 with the main tube 24.

Figure 2:
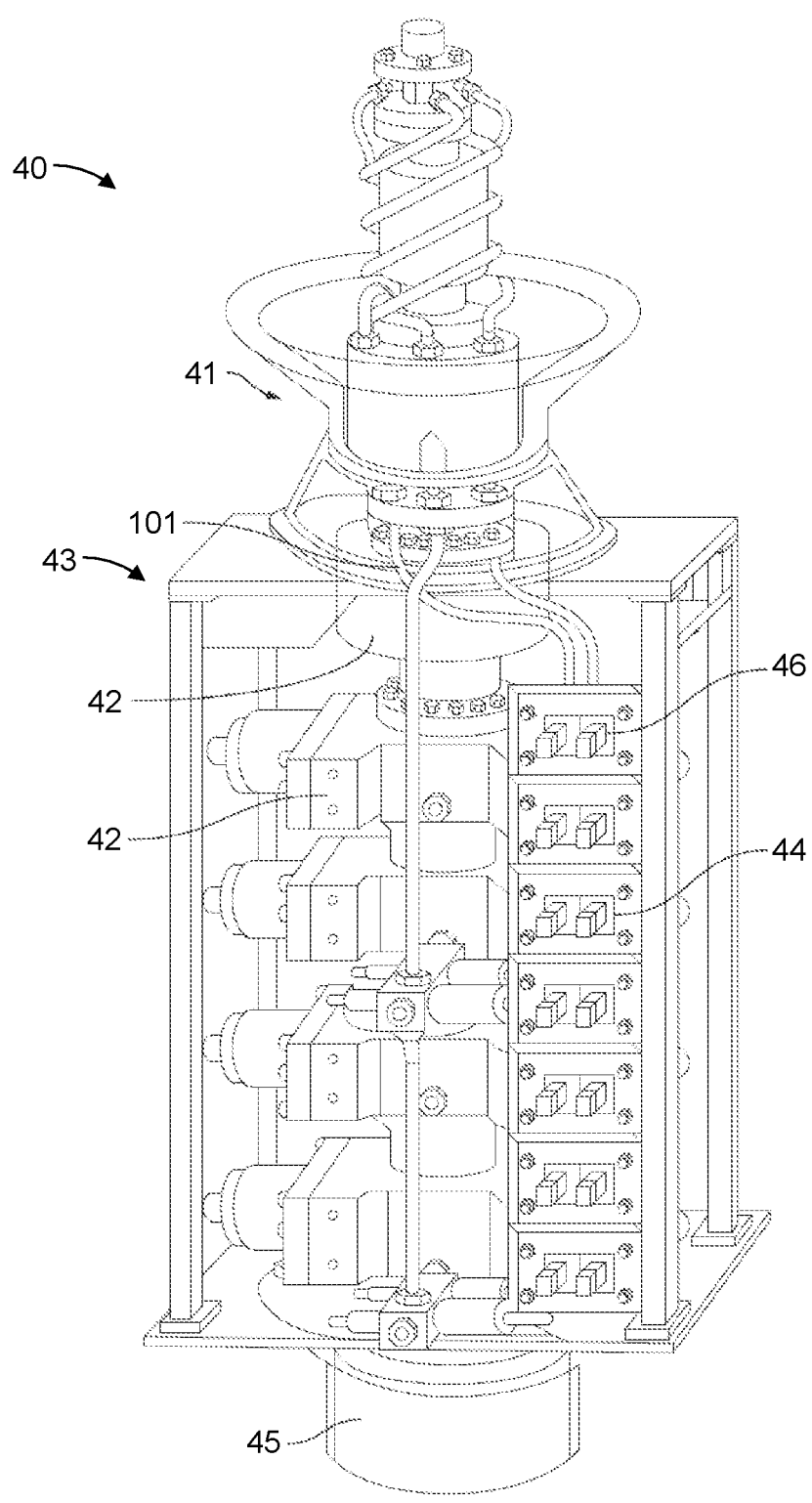
FIG. 2 shows a schematic view of a BOP stack, in accordance with one or more embodiments.

FIG. 2 is a schematic view of a BOP stack 40 including cables 101 to provide communication paths between subsea electronic components, in accordance with one or more embodiments. As shown, the BOP stack 40 includes a riser connector 41, a BOP assembly 43, and a wellhead connector 45. The BOP assembly 43 also includes control pods 44 that are retrievable via a remotely operated vehicle (ROV). The control pods 44 allow for re-configuration of the BOP stack arrangement. The control pods 44 include docking stations 46 configured to receive a communication device on the ROV. The docking stations 46 are in communication with subsea electronic components on the BOP assembly 43, such as electronic components on the blowout preventers 42, via cables 101. It should be appreciated that the cables 101 may also provide communication paths between other subsea electronic components.

Figure 3:
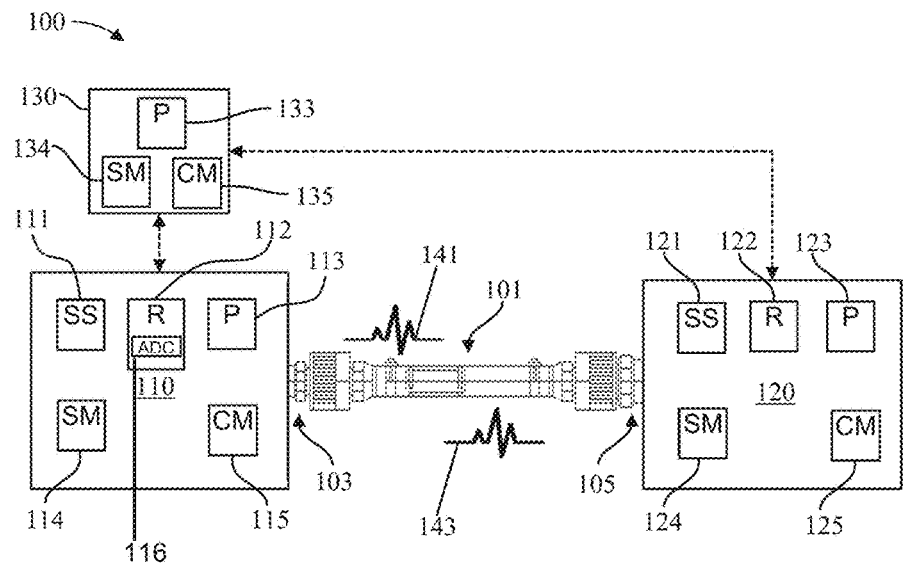
FIG. 3 shows a schematic view of a system including a cable to communicate power and/or data between electronic components in accordance with one or more embodiments of the present disclosure.

FIG. 3 is a schematic view of a system 100 to monitor a fault condition of the cable 101 (FIGS. 1 and 2) used to communicate power and/or data between subsea electronic components and/or housings 110 and 120. The system 100 includes the electronic components 110 and 120 connected via the cable 101 and in communication with an information processing system 130, which may be located on the offshore vessel 10 (FIG. 1), a remotely operated vehicle (ROV), or on a subsea assembly, such as the LMRP 30 or BOP stack 4.

The cable 101 may include a PBOF cable and/or a non-PBOF cable, each housing one or more fiber optic cables, one or more electric cables, one or more electromagnetic cables, or a combination of thereof. The length of the cable 101 can range from about 6 feet (1.83 meters) to about 1000 feet (305 meters). The length of the cable may exceed 1000 feet (304 meters) and be up to about 30,000 feet (9,144 meters) or longer in length, for example in subsea tieback applications. The cable 101 can be subjected to a subsea environment including a temperature between about 32° F. (0° C.) and about 50° F. (10° C.) or more and a depth up to about 15,000 feet (4,572 meters) below sea level. The cable 101 can also be subjected to a temperature between about 4° F. (−20° C.) and about 160° F. (71° C.), for example when the cable 101 is stored at or above sea level or located in a wellbore, during which the cable 101 may be monitored using the techniques described herein.

In one or more embodiments, the electronic components 110 and 120 may be included in a well system, e.g., the well system 5 (FIG. 1). In such an embodiment, one and/or both of the electronic components 110 and 120 may include subsea electronics. One and/or both of the electronic components 110 and 120 may include subsea equipment, such as a subsea BOP or LMRP.

The electronic component 110 can include a signal source 111, a receiver 112, a processor 113, a storage module 114, and a communication module 115. Although the components 111-115 are depicted as being integrated or included in the electronic component 110, it should be appreciated that any of these may be separate components in communication with the electronic component 110, the electronic component 120, and/or the information processing system 130.

The signal source 111 may be configured to generate a signal 141 that is transmitted through the cable 101 to the electronic component 120 to communicate power and/or data to the electronic component 120. The signal source 111 may include a signal transmitter, a signal generator, a modem, a signal amplifier, a power source, or a combination thereof. The signal 141 transmitted by the signal source 111 through the cable 101 can include a digital signal, an analog signal, a power signal, an electromagnetic signal, or a combination thereof.

The receiver 112 can be configured to receive (a) the signal 141 generated by the signal source 111 and (b) a reflection 143 of the signal 141 transmitted through the cable 101. The receiver 112 can include an analog-to-digital converter 116 (ADC) that transforms the signal 141 and any of its reflections 143 into digital samples that can be analyzed or processed as described herein.

The signal source 111 and the receiver 112 can be communicatively coupled to the source end 103 of the cable 101. As described herein, the source end 103 of the cable 101 is intended to refer to a location on the cable 101 where the signal 141 is generated by the signal source 111 and received by the receiver 112. The receiver 112 non-intrusively collects the signal 141 transmitted through the cable 101 from the signal source 111 as well as any reflections 143 to monitor a fault condition of the cable 101. As used herein, non-intrusive reception, collection, and/or monitoring of a signal refers to collecting or receiving one or more signals transmitted through the cable 101 during the operation of the signal source 111, such as during data or power transmission of signals to the electronic component 120. As described herein, non-intrusive generation and/or transmission of a signal refers to transmitting a signal through the cable 101 during the operation of the signal source 111 without generating a separate test signal to monitor the integrity of the cable 101. That is, the signal source 111 may proceed with its intended operation, such as data or power transmission to electronic component 120, while the receiver 112 collects digital samples of those signals without transmitting or receiving a separate test signal to monitor the integrity of the cable 101.

The processor 113 can be in communication with the receiver 112 to analyze samples of the signal 141 and samples of any of its reflections 143 using noise-domain reflectometry (NDR), as described herein. Noise-domain reflectometry refers to a non-intrusive technique of analyzing a medium using the existing signals transmitted through the medium without transmitting a test signal. The processor 113 can be configured to determine a fault condition and/or generate information related to a fault condition of the cable based on the analysis of the signal 141 and any of its reflections 143. The fault condition of the cable 101 can include at least one of a degradation of the cable 101, a bend in the cable 101, a splice in the cable 101, a crack in the cable 101, a degradation of a device attached to the cable 101, a failure of the cable 101, a fluid ingress into the cable 101 (e.g., water entering the housing of the cable 101), an external impact upon the cable 101, a discontinuity (e.g., an impedance or attenuation discontinuity) in the cable 101, a short circuit in the cable 101, and an open circuit in the cable 101.

The control and processing of the samples of the signal 141 and any of its reflections 143 is performed with the use of a computer program on a suitable non-transitory machine readable storage medium that enables the processor 113 to perform the control and processing. The non-transitory machine readable storage medium may include ROM, EPROM, EEPROM, flash memory, a hard disk, a solid state disk, an optical disk, or a combination thereof. As used herein, the term processor is intended to include devices such as a field programmable gate array (FPGA). The results of the processing (such as the information related to the condition of the cable 101) may be output to a suitable medium and/or may be used for determining when to physically inspect, repair, or replace the cable 101. In one or more embodiments, the information related to the fault condition of the cable 101 may include the fault condition encountered along the cable 101; when to physically inspect, repair, or replace the cable 101; an estimated location of a fault condition of the cable 101; an estimated number of fault conditions encountered in the cable 101; the types of fault conditions encountered along the cable 101; and a combination thereof.

The storage module 114 may be used to electronically store samples of the signal 141 and any of its reflections 143 received by the receiver 112 and/or the information generated by the processor 113. For example, in an embodiment in which the electronic component 110 may not be in immediate vicinity to analyze or provide the fault condition of the cable 101, the storage module 114 may be used to temporarily and/or permanently store the samples indicative of the signal 141 and any of its reflections 143, the information related to the fault condition of the cable 101, or a combination thereof. As such, the storage module 114 may include a non-transitory storage medium to enable the fault condition and the samples indicative of the signal 141 and any of its reflections 143 collected by the electronic component 110 to be downloaded to and/or received by, with or without power, the information processing system 130. The non-transitory storage medium may include one or more ROMs, EPROMs, EEPROMs, flash memories, RAMs, hard drives, solid state disks, optical disks, or a combination thereof.

The communication module 115 may be used to transmit data to the information processing system 130. The data transmitted may include samples of the signal 141 and any of its reflections 143 collected by the electronic component 110, the information related to the fault condition generated by the processor 113, or a combination thereof. The communication module 115 may enable data to be output and/or downloaded in real-time, pseudo real-time, and/or at a later time or date. The communication module 115 may therefore include a direct cable connection device to enable a cable to be input into the communication module 115 to transmit and/or upload the fault condition and/or data collected by the electronic component 110 to the information processing system 130. Additionally, or alternatively, the communication module 115 may include a wireless communication device, in which the wireless communication device may include, but is not limited to, an inductive coupling unit, a radio-frequency unit, a radio-frequency identification unit, and/or a suitable wireless communication unit (e.g., ZigBee, Bluetooth, UHF, VHF, Wi-Fi, or the like).

Likewise, the electronic component 120 can include a signal source 121, a receiver 122, a processor 123, a storage module 124, and a communications module 125. As described herein with respect to the embodiments in FIG. 2, the description of the electronic component 110 is applicable to the electronic component 120 as well. That is, the electronic component 120 may be used to monitor the condition of the cable 101 from the source end 105, relative to the electronic component 120.

The system 100 may include the information processing system 130 to remotely analyze the samples of the signal 141 and any of its reflections 143. The information processing system 130 may be located on an offshore vessel 10 of FIG. 1, an ROV, a subsea assembly (e.g., an LMRP or BOP stack) or a device suitable to communicate with the electronic components 110, 120 underwater. The information processing system 130 can include a processor 133, a storage module 134, and a communication module 135. The processor 133 may be configured to analyze the samples of the signals received by the electronic component 110, electronic component 120, or both. Further, the processor 133 may be configured to determine the fault condition of the cable 101 and/or generate information related to the condition of the cable 101 based on the analysis. As an example, the results of the processing may be output to a suitable medium and/or may be used for determining when to physically inspect, repair, or replace the cable 101.

Any one of the processors 113, 123, or 133 may perform an NDR analysis to determine a fault condition of the cable 101 relating to its integrity by detecting a discontinuity in the cable 101, such as an impedance and/or attenuation discontinuity. In particular, the reflection 143 of the signal 141 can be indicative of a fault condition of the cable 101, such as fluid ingress in the housing of the cable 101.

An impedance discontinuity in the cable 101 can produce a reflection 143 of the signal 141 that reflects back to the receiver 112 at the source end 103 of the cable 101. The impedance discontinuity in the cable 101 can refer to a change in impedance of the cable 101 connecting the electronic components 110 and 120. As non-limiting examples, the impedance discontinuity can include a short circuit in the cable 101, an open circuit in the cable 101, or fluid ingress in the cable 101.

In fiber optic and/or electromagnetic (EM) waveguide applications, an attenuation discontinuity can produce a reflection 143 of the signal 141 that travels back to the receiver 112. The attenuation discontinuity can produce a change in absorption of electromagnetic radiation propagating through the cable 101 (e.g., caused by fluid ingress in the cable 101). The attenuation discontinuity in the cable 101 can refer to a change in attenuation of the EM wave traveling through the cable 101. The attenuation discontinuity can indicate a fault condition of the cable 101 caused by a bend in the cable 101, a splice in the cable 101, a crack in the cable 101, damage to the cable 101, an EM device attached to the cable 101 (such as mirrors, reflectors, junction boxes, polarizers, amplifiers, repeaters, fiber optic couplers, multiplexers, and the like), and fluid ingress in the cable 101, for example.

To perform the NDR analysis, the processors 113, 123, or 133 can be used, for example, to analyze N samples of the signal 141 and its reflection 143 (if any) collected by the receiver 112. N samples may include a superposition of the signal 141 and its reflection 143, such as the signal 401 depicted in FIG. 4 discussed below.

Figure 4:
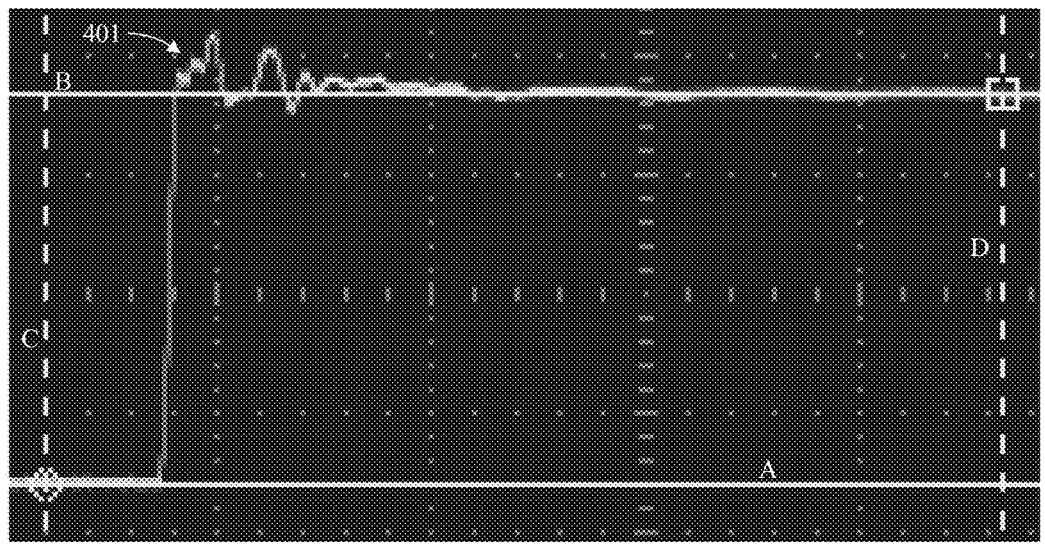
FIG. 4 shows a graph of a signal generated by a signal source in accordance with one or embodiments.

FIG. 4 shows a graph of an example signal 401 received by the receiver 112 on the cable 101, according to one or more embodiments. The signal 401 is plotted as amplitude (mV) as a function of time (μs). The signal 401 represents a digital pulse having a change in voltage of about 328 mV between horizontal lines A and B over a change in time of about 1.7840 μs between vertical lines C and D. The signal 401 demonstrates the resulting digital pulse when there is no discontinuity in the cable 101. Notably, there is no reflection interfering with the digital pulse in the signal 401.

Figure 5:
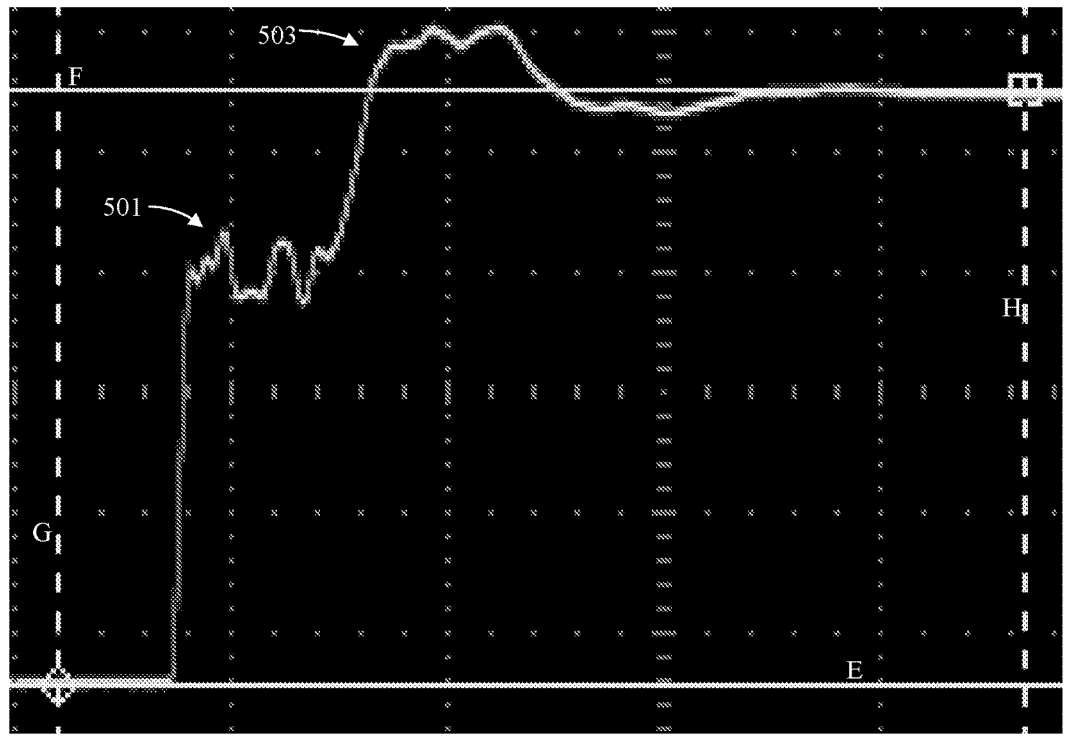
FIG. 5 shows a graph of a signal and its reflection, in accordance with one or more embodiments.

FIG. 5 shows a graph of a signal 501 received by the receiver 112 when there is an open circuit in the cable 101, according to one or more embodiments. The signal 501 is plotted as amplitude (mV) as a function of time (μs). The signal 501 represents a digital pulse having a change in voltage of about 496 mV between horizontal lines E and F over a change in time of about 1.7840 μs between vertical lines G and H. Further, the discontinuity in the cable 101 produces a reflection 503 that is detected by the receiver 112 at the source end 103. The signal 501 demonstrates that there is a detectable discontinuity in the cable 101 produced by an open circuit in the cable 101. FIG. 5 shows that the receiver 112 can sample the superposition of the signal 501 and its reflection 503.

As another example of NDR analysis, the rising edge of a digital pulse can be detected among N samples. If there is no rising edge detected, this may mean that there is a short in the cable 101. It can be determined whether a discontinuity exists after the rising edge of the digital pulse by comparing the discontinuity to a threshold parameter. As an example, the threshold parameter can include a threshold voltage corresponding to the maximum operational voltage of a logical state of a digital signal. As another example, the threshold parameter can include a threshold intensity, power, and/or signal strength in decibels, corresponding to a maximum operational value of the reflectivity, power, intensity, or signal strength applied to the cable 101, in fiber optic or EM waveguide applications. If the discontinuity exceeds the threshold parameter, this can mean that there is a reflection in the samples of the signal. If the discontinuity is below the threshold parameter, this can mean that there is additional absorption of the EM wave traveling through the cable 101. If a discontinuity exists in the samples of the signal, this can be an indication that the cable 101 might need repair, replacement, or physically inspection.

Optionally, $M_1$ samples (e.g., 100 samples) after the rising edge of the signal can be averaged and compared with a base case of $M_2$ samples in which the cable 101 has no fluid ingress in its housing. If the average of $M_1$ samples is less than the base average of $M_2$ samples, this indicates that the rise time of the signal takes longer to reach the threshold parameter than the base case and that the housing of the cable 101 is compromised by a fluid other than oil, such as water. Comparing these averages can be used to determine whether there is fluid ingress in the cable 101.

Figure 6:
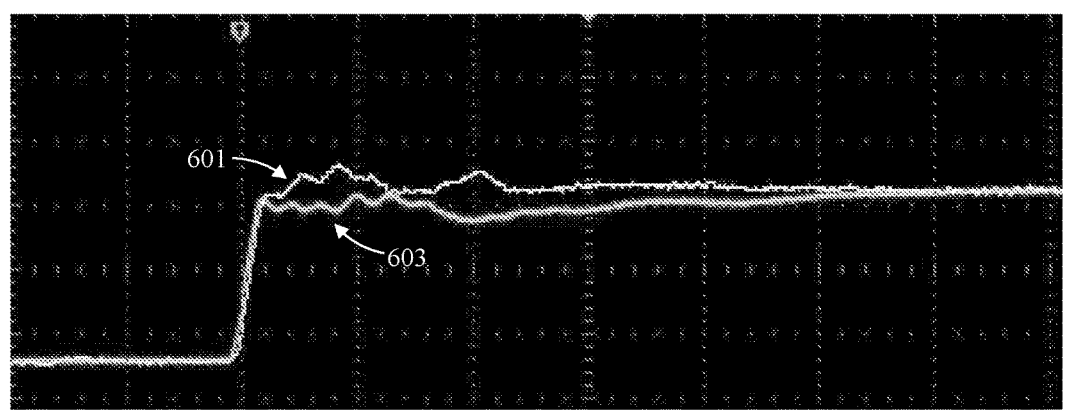
FIG. 6 shows a graph of two signals, one representative of no fluid ingress in the cable, and the other representative of fluid ingress in the cable, in accordance with one or more embodiments.

FIG. 6 shows a graph of example signals 601 and 603 received by the receiver 112, according to one or more embodiments. The signals 601 and 603 are plotted as amplitude (mV) as a function of time (μs). The signal 601 demonstrates the digital pulse received by the receiver 112 when the cable 101 is a PBOF cable with no external fluid ingress in the housing of the cable 101. To simulate the effects of fluid ingress in the cable 101, the oil in the PBOF cable can be replaced with water. The signal 603 shows the digital pulse received by the receiver 112 when the cable 101 is a PBOF cable and the oil is substituted for water in the housing of the cable 101. The signals 601, 603 demonstrate that the rise time of the signal 603 is noticeably slower than the rise time of the signal 601.

For analog or power signals, a reflection may be detected among N samples by comparing N samples to a threshold parameter, such as a threshold voltage or current. If any sample of N samples exceed the threshold parameter, this can indicate that there is an impedance discontinuity in the cable 101.

The location of the discontinuity in the cable 101 can be estimated using the length of the cable 101, the velocity of propagation of the signal through the cable 101, and the time delay between a pre-determined start point of the signal (such as the rising edge of a digital pulse) and the reflection. This time delay approximates the time for the signal to reach a discontinuity in the cable 101 and return to the receiver 112 at the source end 103. Thus, the processor 113 may be configured to use parameters indicative of (a) the length of the cable 101, (b) the velocity of propagation of the cable 101, and (c) the time delay between a predetermined start point of the signal and its reflection to determine the location of a discontinuity in the cable 101.

Information relating to the fault condition of the cable 101 can be generated by any of the processors 113, 123, and 133 and output to a suitable medium. Also, the storage module(s) 114, 124, or 134 may be used to electronically store the information generated by the processors 113, 123, and 133. As an example, the processor 113 may communicate to a display or storage module 114, 124, or 134 the estimated location of a break in the cable 101 or that fluid ingress has likely occurred in the cable 101. Using this information, it can be determined whether and/or when to physically inspect, repair, or replace the cable 101.

It will be appreciated that the discussion regarding the NDR analysis of the signal generated by the electronic component 110 is applicable to a signal generated by the electronic component 120 as well. In particular, the condition of the cable 101 can be determined by generating a signal using the signal source 121, collecting samples of the signal and any of its reflections using the receiver 122 at the other source end 105, and analyzing the signal and any of its reflections using the processor 123. It will also be understood that the processor 133 may be used to remotely perform any of the processing or analysis described herein applying to the processors 113 or 123. The processing or analysis may be distributed among the processors 113, 123, and 131.

This discussion is directed to various embodiments of the present disclosure. The drawing figures are not necessarily to scale. Certain features of the embodiments may be shown exaggerated in scale or in somewhat schematic form and some details of conventional elements may not be shown in the interest of clarity and conciseness. Although one or more of these embodiments may be preferred, the embodiments disclosed should not be interpreted, or otherwise used, as limiting the scope of the disclosure, including the claims. It is to be fully recognized that the different teachings of the embodiments discussed may be employed separately or in any suitable combination to produce desired results. In addition, one skilled in the art will understand that the description has broad application, and the discussion of any embodiment is meant only to be exemplary of that embodiment, and not intended to suggest that the scope of the disclosure, including the claims, is limited to that embodiment.

Certain terms are used throughout the description and claims to refer to particular features or components. As one skilled in the art will appreciate, different persons may refer to the same feature or component by different names. This document does not intend to distinguish between components or features that differ in name but not function, unless specifically stated. In the discussion and in the claims, the terms "including" and "comprising" are used in an open-ended fashion, and thus should be interpreted to mean "including, but not limited to . . . ." Also, the term "couple" or "couples" is intended to mean either an indirect or direct connection. In addition, the terms "axial" and "axially" generally mean along or parallel to a central axis (e.g., central axis of a body or a port), while the terms "radial" and "radially" generally mean perpendicular to the central axis. The use of "top," "bottom," "above," "below," and variations of these terms is made for convenience, but does not require any particular orientation of the components.

Reference throughout this specification to "one embodiment," "an embodiment," or similar language means that a particular feature, structure, or characteristic described in connection with the embodiment may be included in at least one embodiment of the present disclosure. Thus, appearances of the phrases "in one embodiment," "in an embodiment," and similar language throughout this specification may, but do not necessarily, all refer to the same embodiment.

Although the present invention has been described with respect to specific details, it is not intended that such details should be regarded as limitations on the scope of the invention, except to the extent that they are included in the accompanying claims.

What is claimed is:

1. A system to monitor a cable, comprising:
   a receiver configured to receive a signal and a reflection of the signal transmitted through the cable, wherein the reflection of the signal is indicative of a fault condition relating to the integrity of the cable, and wherein the cable comprises at least one of a pressure balanced oil-filled (PBOF) cable and a non-pressure balanced oil-filled (non-PBOF) cable; and
   a processor in communication with the receiver and programmed to analyze the signal and the reflection using noise-domain reflectometry and determine the fault condition of the cable, wherein the processor is programmed to detect impedance discontinuity, detect attenuation discontinuity, analyze a superposition of the signal and the reflection, detect a rising edge in the signal, compare a rise time of the signal to a target rise time, or any combination thereof, to analyze the signal and the reflection using noise-domain reflectometry.

2. The system of claim 1, wherein the fault condition of the cable comprises at least one of a degradation of the cable, a bend in the cable, a splice in the cable, a crack in the cable, a failure of the cable, a fluid ingress in the cable, an external impact upon the cable, a degradation of a device attached to the cable, a discontinuity in the cable, a short circuit in the cable, and an open circuit in the cable.

3. The system of claim 1, wherein the receiver comprises an analog to digital converter (ADC).

4. The system of claim 1, wherein the signal is at least one of a digital signal, an analog signal, a power signal, and an electromagnetic signal.

5. The system of claim 1, wherein the cable is connectable with a subsea component.

6. The system of claim 1, wherein the cable is connectable to a subsea blowout preventer.

7. The system of claim 1, wherein the cable is subjected to a temperature between about 32° F. (0° C.) and about 50° F. (10° C.) and a depth up to about 15,000 feet (4,572 meters) below sea level.

8. The system of claim 1, further comprising:
a signal source configured to non-intrusively generate the signal transmitted through the cable; and
a subsea component communicatively coupled to the cable and configured to receive the signal; and
wherein the receiver is configured to non-intrusively receive the signal and the reflection of the signal.

9. The system of claim 1, wherein the processor is further programmed to use a parameter indicative of a length of the cable to analyze the signal.

10. The system of claim 1, wherein the processor is programmed to analyze the superposition of the signal and the reflection, and wherein the processor is configured to determine the fault condition of the cable when the superposition of the signal and the reflection comprises an amplitude that is above a threshold amplitude.

11. The system of claim 1, wherein the processor is programmed to detect the rising edge in the signal by comparing the rising edge to a threshold parameter, by comparing an average of samples of the signal collected after the rising edge is detected to a base case, or both, and wherein the processor is configured to determine the fault condition of the cable when the rising edge exceeds the threshold parameter, when the average of samples of the signal collected after the rising edge is below the base case, or both.

12. The system of claim 1, further comprising a signal source configured to non-intrusively transmit the signal through the cable, wherein the signal source and the receiver are communicatively coupled to a source end of the cable.

13. A method to monitor a cable, comprising:
receiving a signal and a reflection of the signal transmitted through the cable using a receiver communicatively coupled to the cable, wherein the reflection is indicative of a fault condition of the cable, and wherein the cable comprises at least one of a pressure balanced oil-filled (PBOF) cable and a non-pressure balanced oil-filled (non-PBOF) cable; and
analyzing the signal and the reflection using noise-domain reflectometry to determine the fault condition of the cable by detecting impedance discontinuity, detecting attenuation discontinuity, analyzing a superposition of the signal and the reflection, detecting a rising edge in the signal, comparing a rise time of the signal to a target rise time, or any combination thereof.

14. The method of claim 13, wherein the fault condition of the cable comprises at least one of a degradation of the cable, a bend in the cable, a splice in the cable, a crack in the cable, a failure of the cable, a fluid ingress in the cable, an external impact upon the cable, a degradation of a device attached to the cable, a discontinuity in the cable, a short circuit in the cable, and an open circuit in the cable.

15. The method of claim 13, further comprising non-intrusively transmitting the signal through the cable.

16. The method of claim 13, further comprising:
non-intrusively generating the signal at a source end of the cable; and
wherein receiving further comprises non-intrusively receiving the signal and the reflection at a source end of the cable.

17. The method of claim 13, wherein analyzing further comprises analyzing the signal and the reflection using noise-domain reflectometry with a processor.

18. The method of claim 13, wherein the signal is at least one of a digital signal, an analog signal, a power signal, and an electromagnetic signal.

19. The method of claim 13, further comprising connecting the cable to a subsea component.

20. The system of claim 1, wherein the processor is configured to compare the rise time of the signal to the target rise time, and wherein the processor is configured to determine the fault condition of the cable when the rise time of the signal is less than the target rise time.

* * * * *